(12) United States Patent
Nguyen et al.

(10) Patent No.: US 11,664,360 B2
(45) Date of Patent: *May 30, 2023

(54) CIRCUIT BOARD WITH SPACES FOR EMBEDDING COMPONENTS

(71) Applicant: Micron Technology, Inc., Boise, ID (US)

(72) Inventors: Quang Nguyen, Boise, ID (US); Christopher Glancey, Boise, ID (US); Shams U Arifeen, Bellevue, WA (US); Koustav Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/566,397

(22) Filed: Dec. 30, 2021

(65) Prior Publication Data

US 2022/0122958 A1 Apr. 21, 2022

Related U.S. Application Data

(63) Continuation of application No. 17/023,037, filed on Sep. 16, 2020, now abandoned.

(51) Int. Cl.
| | |
|---|---|
| *H01L 25/18* | (2023.01) |
| *H05K 1/18* | (2006.01) |
| *H01L 23/00* | (2006.01) |
| *H01L 25/00* | (2006.01) |
| *H05K 3/34* | (2006.01) |
| *H05K 1/02* | (2006.01) |
| *H05K 3/00* | (2006.01) |

(52) U.S. Cl.
CPC ............. *H01L 25/18* (2013.01); *H01L 24/16* (2013.01); *H01L 25/50* (2013.01); *H05K 1/0271* (2013.01); *H05K 1/183* (2013.01); *H05K 3/3436* (2013.01); *H01L 2224/16225* (2013.01); *H01L 2924/15153* (2013.01); *H05K 3/0017* (2013.01); *H05K 2201/10159* (2013.01)

(58) Field of Classification Search
CPC ......... H01L 25/18; H01L 25/50; H01L 24/16; H01L 2224/16225; H05K 1/0271; H05K 1/183
USPC ........................................................ 361/748
See application file for complete search history.

(56) References Cited

U.S. PATENT DOCUMENTS

| | | |
|---|---|---|
| 7,730,612 B2 | 6/2010 | Park et al. |
| 9,629,248 B2 | 4/2017 | Kwon et al. |
| 2006/0218782 A1 | 10/2006 | Tuominen et al. |
| 2007/0195505 A1 | 8/2007 | Savignac et al. |
| 2010/0282498 A1 | 11/2010 | Tezak et al. |

(Continued)

FOREIGN PATENT DOCUMENTS

| | | |
|---|---|---|
| JP | 2002368041 A | 12/2002 |
| WO | WO-2022060637 A1 | 3/2022 |

OTHER PUBLICATIONS

US 11,217,576 B1, 01/2022, Nguyen et al. (withdrawn)

(Continued)

*Primary Examiner* — Andargie M Aychillhum
(74) *Attorney, Agent, or Firm* — Schwegman Lundberg & Woessner, P.A.

(57) ABSTRACT

Various embodiments described herein provide for printed circuit boards with one or more spaces for embedding components, which can be used to implement a memory sub-system.

11 Claims, 6 Drawing Sheets

(56) References Cited

U.S. PATENT DOCUMENTS

| | | |
|---|---|---|
| 2010/0326714 A1 | 12/2010 | Fukuzono |
| 2011/0259630 A1 | 10/2011 | Park |
| 2012/0090883 A1 | 4/2012 | Bchir et al. |
| 2015/0097633 A1 | 4/2015 | Devries et al. |
| 2016/0079195 A1 | 3/2016 | Tanaka |
| 2018/0315735 A1 | 11/2018 | Delacruz et al. |
| 2019/0273030 A1 | 9/2019 | Lim et al. |
| 2020/0045825 A1 | 2/2020 | Wu et al. |
| 2020/0091156 A1* | 3/2020 | Sharma ................ G11C 11/403 |
| 2020/0105640 A1 | 4/2020 | Chiu et al. |
| 2020/0126919 A1* | 4/2020 | Kang ................ H01L 23/5226 |
| 2021/0013155 A1 | 1/2021 | Osgood |
| 2021/0057317 A1 | 2/2021 | Park et al. |
| 2022/0085002 A1 | 3/2022 | Nguyen et al. |

OTHER PUBLICATIONS

"International Application Serial No. PCT/US2021/049886, International Search Report dated Dec. 22, 2021", 4 pgs.
"International Application Serial No. PCT/US2021/049886, Written Opinion dated Dec. 22, 2021", 4 pgs.

* cited by examiner

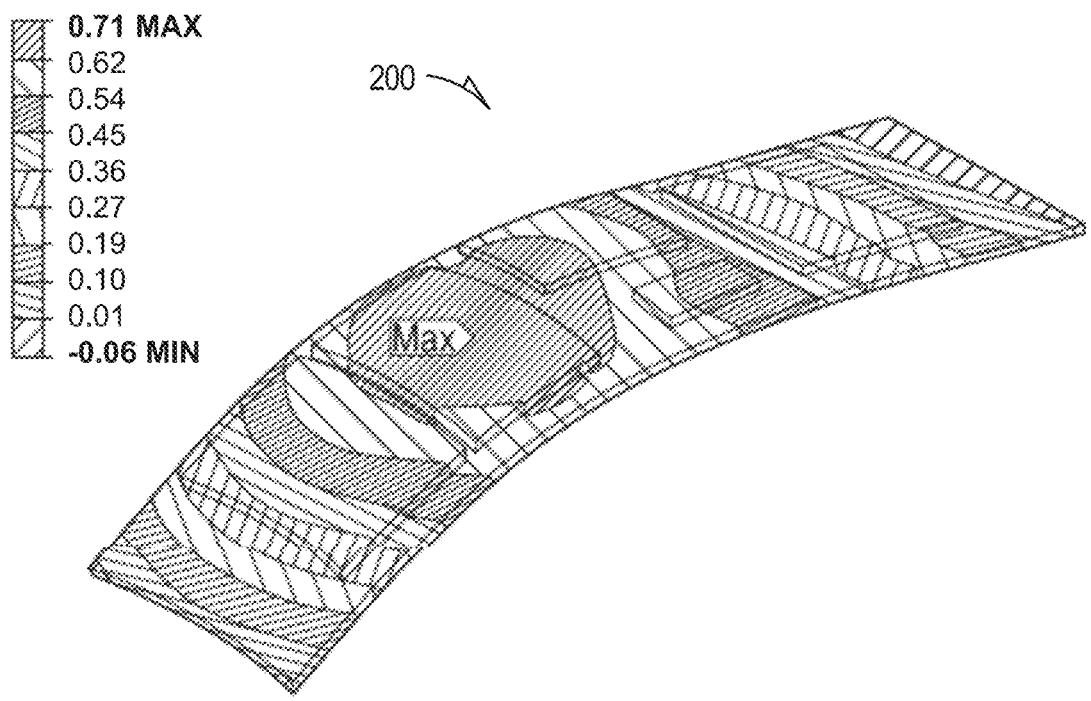
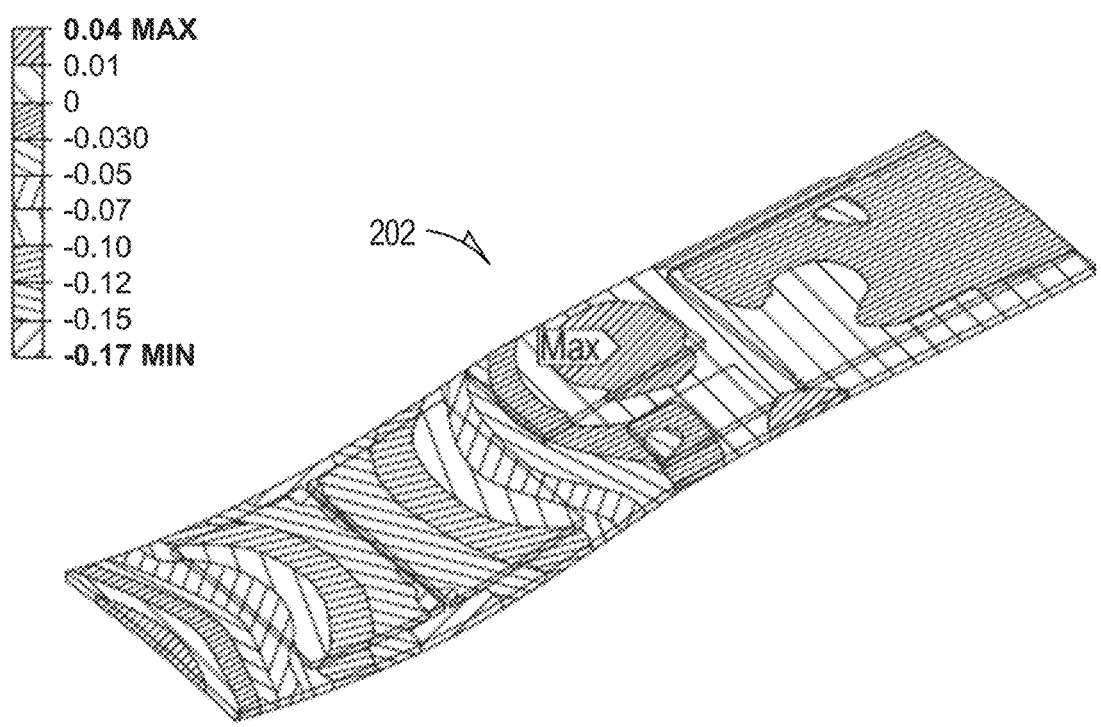
FIG. 2

400

```
┌─────────────────────────────────┐
│ CONFIGURE CIRCUIT DESIGN DATA FOR │
│   FORMING PRINTED CIRCUIT BOARD   │──402
│    COMPRISING OUTER LAYER THAT    │
│  COMPRISES FIRST EXTERIOR SURFACE │
│  AND SET OF EMBEDDED SPACES EACH  │
│   HAVING SECOND EXTERIOR SURFACE  │
└─────────────────────────────────┘
                  │
                  ▼
┌─────────────────────────────────┐
│ CONFIGURE CIRCUIT DESIGN DATA TO  │──404
│   DISPOSE SET OF COMPONENTS ON    │
│  PRINTED CIRCUIT BOARD AT SET OF  │
│          EMBEDDED SPACES          │
└─────────────────────────────────┘
```

*FIG. 4*

CIRCUIT BOARD WITH SPACES FOR EMBEDDING COMPONENTS

PRIORITY APPLICATION

This application is a continuation of U.S. application Ser. No. 17/023,037, filed Sep. 16, 2020, which is incorporated herein by reference in its entirety.

TECHNICAL FIELD

Embodiments of the disclosure relate generally to circuit boards and more specifically, relate to printed circuit boards with one or more spaces for embedding components, which can be used to implement a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a rendering that illustrates warpage of an example printed circuit board that uses one or more embedded spaces to embed components, in accordance with some embodiments of the present disclosure.

FIGS. 3 and 4 are flow diagrams of example methods for producing a printed circuit board with one or more spaces for embedding components, in accordance with some embodiments of the present disclosure.

DETAILED DESCRIPTION

Figure 1:
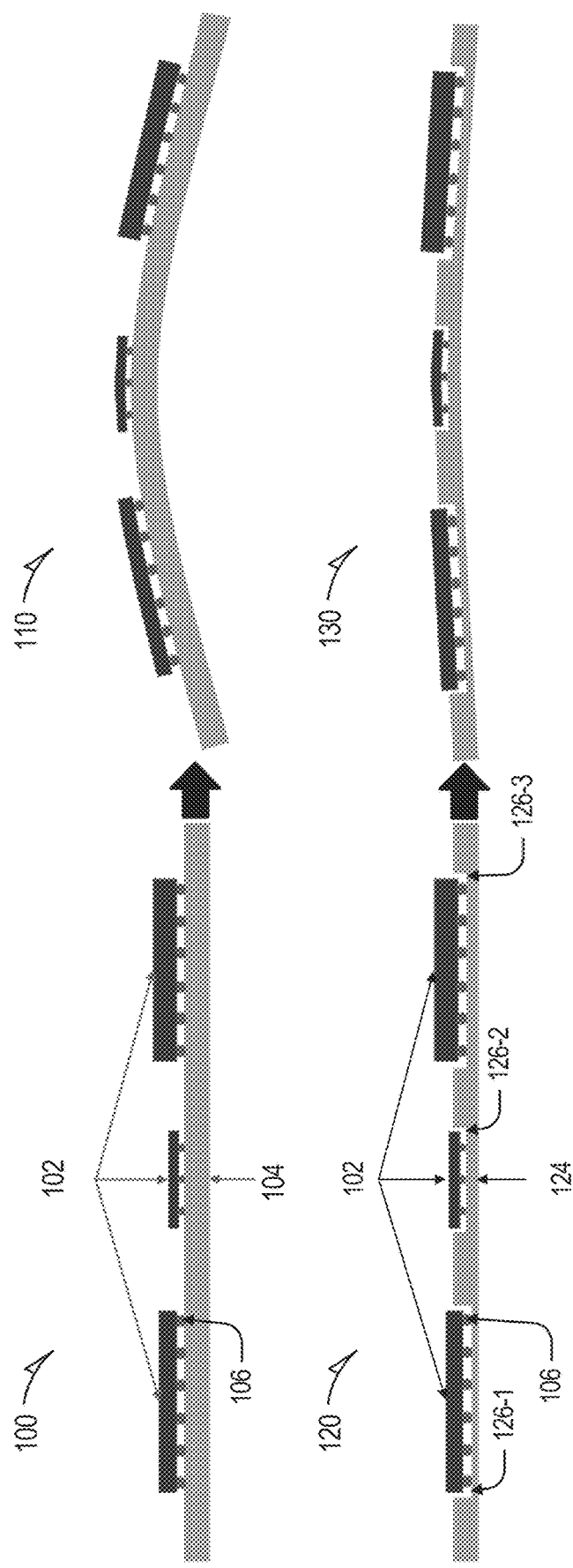
FIG. 1 is a diagram illustrating an example printed circuit board with one or more spaces for embedding components, in accordance with some embodiments of the present disclosure.

Aspects of the present disclosure are directed to printed circuit boards with one or more spaces for embedding components, which can be used to implement a memory sub-system, such as a U.2 form factor or a M.2 form factor (e.g., M.2 Type 2260, 2280, 22110, etc.) solid-state drive (SSD) or a dual in-line memory module (DIMM) (e.g., FBDIMM, Mini-DIMM, SODIMM, UDIMM, etc.). Various embodiments described herein can be extended to any printed circuit board assembly or any printed circuit board (PCB) undergoing solder mounting or a component attachment process, such as motherboards, daughter cards, or the like. A memory sub-system can be a storage device, a memory module, or a hybrid of a storage device and memory module. Examples of storage devices and memory modules are described below in conjunction with FIG. 5. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more die. Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally (for example, by an external controller). The memory devices can be managed memory devices (e.g., managed NAND), which are raw memory devices combined with local embedded controllers for memory management within the same memory device package. A memory device can also be a volatile memory device, such as a dynamic random access memory (DRAM) device.

Various electronic devices, such as memory sub-systems (e.g., SSDs, DIMMs), are implemented using one or more printed circuit boards. Generally, assembly of a printed circuit board (PCB) can involve one or more cooling processes (e.g., with temperatures ranging between 220-25° C.), which can result in warpage of the printed circuit board (e.g., warpage observed once the printed circuit board is at room temperature). Factors that contribute to warpage of a printed circuit board can include, without limitation, a mismatch between a coefficient of thermal expansion (CTE) of the printed circuit board and the CTE of one or more components (e.g., passive elements, packaged integrated circuits (ICs), etc.) mounted on the printed circuit board. For a printed circuit board, which usually comprises composite material (e.g., layers of metal, resin, epoxy, glass, etc.), the CTE can be 15-20 parts per million per degree Celsius (ppm/° C.) for example. For a component mounted on a printed circuit board, which can comprise a package (e.g., ceramic package), the CTE is usually lower than that of the printed circuit board (e.g., CTE of a package 7-12 ppm).

Aspects of the present disclosure can reduce warpage of a printed circuit board by reducing an effect of a CTE mismatch between the printed circuit board and one or more components mounted on the printed circuit board. Various embodiments described herein provide for a printed circuit board that comprises one or more spaces (also referred to herein as embedded spaces) for mounting components onto the printed circuit board. According to some embodiments, an embedded space) is disposed on an outer layer of a printed circuit board, where a component can be mounted on the printed circuit board at (e.g., into) the embedded space. By mounting a component at an embedded space of a printed circuit board, various embodiments permit the component to be embedded into the printed circuit board. In this way, some embodiments can reduce the distance between a component (mounted on a printed circuit board) and a center of the printed circuit board, which in turn can reduce/mitigate the effect of CTE mismatch between the component and the printed circuit board and the warpage it can cause the printed circuit board (e.g., at the end of assembly). The embedded space permits some embodiments to reduce the volume of printed circuit board underneath a component, which can reduce/mitigate the CTE mismatch. Additionally, by mounting a component at an embedded space of a printed circuit board, various embodiments can reduce the height of the component relative to the printed circuit board, which in turn can assist in reducing the overall profile (e.g., thickness) of the combination of the printed circuit board and the mounted component. Use of one or more embedded spaces can be particularly useful with respect to applications of single-sided printed circuit boards.

For a given printed circuit board, the depth of an individual embedded space can depend on the location of warpage observed for the printed circuit board, the amount of warpage observed for the printed circuit board, the component intended to be mounted at the individual embedded space, or some combination thereof. Likewise, the location of the individual embedded space on the given printed circuit board can depend on the location of warpage observed for the printed circuit board, the amount of warpage observed for the printed circuit board, the component intended to be mounted at the individual embedded space, or some combination thereof. The dimensions of a given embedded space can be sufficiently large to allow the given embedded space to receive the component intended to be mounted therein (e.g., dimensions of the given embedded space are slightly larger than the footprint of the component). Depending on the embodiment, a wire or a connection of a printed circuit board can be routed around or beneath a given embedded space.

Various embodiments provide for an apparatus that comprises a printed circuit board, and a set of components disposed on the printed circuit board, where the printed circuit board comprises an outer layer comprising a first exterior surface; and a set of embedded spaces, where each embedded space has a second exterior surface that is positioned closer to a center (e.g., centerline) of the printed circuit board than the first exterior surface, and where the set of components is disposed on the printed circuit board at the set of embedded spaces. Where some embodiments implement a memory sub-system (e.g., the memory sub-system comprising a SSD or a DIMM), the set of components can comprise a memory sub-system control, a set of memory devices (e.g., NAND-based memory devices), or both. For instance, the PCB produced by various embodiments described herein can be used to implement various form factors of U.2 SSDs, of M.2 SSDs (e.g., M.2 Type 2260, 2280, 22110, etc.) or of DIMMs (e.g., FBDIMM, Mini-DIMM, SODIMM, UDIMM, etc.), which use different dimensions of PCBs. Depending on the embodiment, a printed circuit board as described herein can reduce warpage of the printed circuit board, reliability of one or more solder joints of the printed circuit board, or reduce overall profile (e.g., thickness) of the printed circuit board.

As used herein, a printed circuit board (PCB) assembly can refer to a printed circuit board after one or more components are mounted to a PCB. As used herein, a component that can mount on a printed circuit board can include, without limitation, a passive element, an active element, or an integrated circuit (e.g., a surface-mounted IC package or a circuit chip). An example component can include, without limitation, a memory sub-system controller, a media controller a hardware processor, a non-volatile memory device (e.g., NAND-based memory device), a volatile memory device (e.g., DRAM device), and the like. As also used herein, a coefficient of thermal expansion (CTE) (also referred to as CTE value) can indicate how much a material expands or contracts with temperature change of the material (e.g., temperature change that the material can experience during a printed circuit board assembly process). For instance, the higher the CTE value of a material, the more the material expands or contracts with a change in temperature of the material.

Disclosed herein are some examples of systems, methods, devices and the like that relate to a printed circuit board having one or more spaces for embedding components, which can be used to implement a memory sub-system, as described herein.

FIG. 1 is a diagram illustrating an example printed circuit board 120 with one or more spaces for embedding components, in accordance with some embodiments of the present disclosure. For comparison purposes, FIG. 1 also illustrates an example of a printed circuit board 100 produced in accordance with a traditional methodology. As shown, each of the printed circuit boards 100 and 120 have components 102 disposed (e.g., mounted or soldered) on their respective outer layer 104, 124. For the printed circuit board 100, the components 102 are surface-mounted onto the outer layer 104 (e.g., during an assembly process). In FIG. 1, element 106 can represent an interconnect of one of the components 102. The printed circuit board 110 represents the printed circuit board 100 after the printed circuit board 100 cools (e.g., to room temperature) following an assembly process. Each of the printed circuit board 100 and the components 102 expand or contract based on their respective CTE. As described herein, in some instances, a printed circuit board can experience a temperature higher than +200° C. during an assembly process.

In contrast, the outer layer 124 of the printed circuit board 120 comprises embedded spaces 126-1, 126-2, and 126-3 (collectively referred to as embedded spaces 126), and the components 102 are each disposed (e.g., mounted or soldered) on to an exterior surface of one of the embedded spaces 126 (e.g., during an assembly process). Accordingly, one side (e.g., underside) of each of the components 102 couples to an exterior surface of one of the embedded spaces 126 (e.g., by way of an interconnect disposed on the underside). For FIG. 1, it can be assumed that the printed circuit board 100 and the printed circuit board 120 share the same CTE. As shown, the (second) exterior surface of each of the embedded spaces 126 is lower, and thus closer to a center of the printed circuit board 120, than the (first) exterior surface of the outer layer 124. In comparison to the printed circuit board 100, the lower exterior surface provided by each of the embedded spaces 126 permits the distance between the components 102 and the center of the printed circuit board 120 to be reduced. As described herein, reducing this distance can reduce the effect CTE mismatch between the components 102 and the printed circuit board 120 has on warpage of the printed circuit board 120. The embedded spaces 126 can reduce the volume of the printed circuit board 120 underneath the components 102, which can reduce/mitigate the CTE mismatch between the printed circuit board 120 and the components 102. Additionally, by mounting the components 102 at the embedded spaces 126 of the printed circuit board 120, various embodiments can reduce the height of the components 102 relative to the printed circuit board 120, which in turn can assist in reducing the overall profile of the combination of the printed circuit board 120 and the components 102 as mounted. The printed circuit board 130 represents the printed circuit board 120 after the printed circuit board 120 cools (e.g., to room temperature) following an assembly process. According to various embodiments, the use of embedded spaces 126 to couple the components 102 to the printed circuit board 120 results in the warpage of the printed circuit board 130 being is significantly less than the warpage of the printed circuit board 110.

FIG. 2 is a rendering that illustrates warpage of an example printed circuit board 202 that uses one or more embedded spaces to embed components, in accordance with some embodiments of the present disclosure. For comparison purposes, FIG. 2 also illustrates an example of a printed circuit board 200 produced in accordance with a traditional methodology. For some embodiments, each of the printed circuit boards 200, 202 represents a PCB to implement a memory sub-system, such as a U.2 form factor SSD, a M.2 form factor SSD, or a DIMM. In FIG. 2, the printed circuit board 200 and the printed circuit board 202 differ only in that the printed circuit board 202 uses one or more embedded spaces to embed components. For some embodiments, each of the printed circuit boards 200, 202 represents a data storage device (e.g., SSD) with NAND-based memory devices (e.g., NAND memory die) disposed on their outer layers. As shown, the warpage of the printed circuit board 202 is significantly less than that of the printed circuit board 200. The warpage observed with respect to the printed circuit board 200 can determine (or assist in determining) the dimension, the location, the or depth of each embedded space used by the printed circuit board 202 to reduce the observed warpage.

Figure 3:
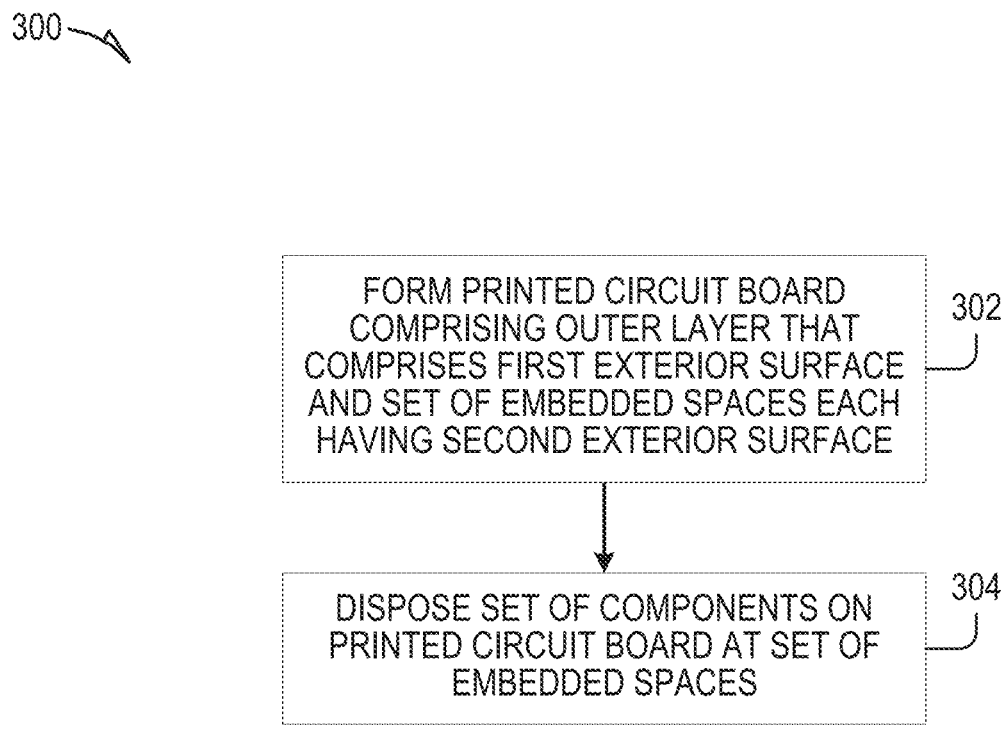

FIG. 3 is a flow diagram of an example method 300 for producing a printed circuit board with one or more spaces for embedding components, in accordance with some embodiments of the present disclosure. The diagrams illustrated herein should be understood only as examples, and one or more processes can be omitted in various embodiments. Thus, not all processes are used in every embodiment. Other process flows are possible.

At operation 302, a printed circuit board is formed where the printed circuit board comprises an outer layer, where the outer layer comprises a first exterior surface and a set of embedded spaces, and where each embedded space has a second exterior surface. The printed circuit board can implement a memory sub-system, such as a U.2 form factor SSD, a M.2 form factor SSD, or a DIMM. For example, the depending on the embodiment, the printed circuit board can conform with a U.2 form factor SSD, a SSD M.2 form factor, or with a DIMM form factor. For some embodiments, each embedded space in the set of embedded spaces is positioned closer to a center of the printed circuit board (e.g., centerline of the printed circuit board that is parallel to the outer layer of the printed circuit board) than the first exterior surface of the outer layer of the printed circuit board. Dimensions (e.g., width, length, or depth/height) of a given embedded space of the set of embedded spaces can be sufficiently large to receive a given component intended to be mounted at the given embedded space. For instance, the dimensions of the given embedded space can be slightly larger than the footprint of the given component. Depending on the embodiment, a wire or a connection of a printed circuit board can be routed around or beneath a given embedded space.

The process by which the printed circuit is formed can vary between various embodiments. For some embodiments, forming the printed circuit board comprises using one or more placeholder components, such as plugs or dummy PCB components, to form one or more embedded spaces. For instance, prior to forming the outer layer of the printed circuit board, a set of placeholder components is disposed on an intermediate layer (e.g., metal, resin, epoxy, or glass layer) of the printed circuit board. The outer layer can be form on the intermediate layer of the printed circuit board. Eventually, the set of placeholder components can be removed (from the printed circuit board) to form the set of embedded spaces in the outer layer of the printed circuit board. According to some embodiments, a given placeholder component prevents at least a portion of the outer layer of the printed circuit board from forming, on the printed circuit board, where the given placeholder component is placed/positioned. Depending on the embodiment, the type of placeholder used as a given placeholder, or where the given placeholder is placed/positioned, can determine a depth or a location of an embedded space formed by the given placeholder (e.g., depth and location of embedded space variable to the component it is intended to receive).

For some embodiments, forming the printed circuit board comprises using an etching process. For example, forming the printed circuit board can comprise forming the outer layer on the intermediate layer of the printed circuit board, and etching a set of portions of the outer layer to form the set of embedded spaces.

For various embodiments, disposing the set of components on the printed circuit board at the set of embedded spaces comprises coupling a first component, of the set of components, to the second exterior surface of a first embedded space of the set of embedded spaces. For instance, coupling the first component to the second exterior surface of the first embedded space can comprise soldering a set of interconnects (e.g., pins) of the first component to a set of connections (e.g., pads) disposed on the second exterior surface of the first embedded space. The first component, for example, can comprise the set of interconnects underneath the first component (e.g., interconnects disposed on the underside of a package of an IC). Alternatively, or additionally, coupling the first component to the second exterior surface of the first embedded space can comprise soldering a set of interconnects of the first component to a set of traces disposed along an edge of the first embedded space. The first component, for example, can comprise the set of interconnects along at least one edge of the first component (e.g., interconnects disposed on the edge of a package of an IC). Depending on the embodiment, the traces can be disposed on the first exterior surface along an edge (e.g., the perimeter) of a given embedded space, disposed on the walls of the given embedded space, or disposed on the second exterior surface of the given embedded space.

At operation 304, a set of components is disposed on the printed circuit board at the set of embedded spaces. For some embodiments, the printed circuit board is for a memory sub-system and the set of components comprises: a set of memory devices for storing data from a host system; and a memory sub-system controller that is operatively coupled to the set of memory devices, where the memory sub-system controller enables data transfer between the set of memory devices and the host system. According to various embodiments, at least one component of the set of components has a first coefficient of thermal expansion that is lower than a second coefficient of thermal expansion of the printed circuit board (e.g., component CTE is lower than PCB CTE). As described herein, at least one component of the set of components can comprise a surface-mounted integrated circuit (IC) package. The printed circuit board that results from the method 300 can be a single-sided printed circuit board, where the set of components are disposed on a single-side of the printed circuit board.

FIG. 4 is a flow diagram of an example method 400 for producing a printed circuit board with one or more spaces for embedding components, in accordance with some embodiments of the present disclosure. The method 400 can be performed with the assistance of processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed at least in part by a circuit design system (e.g., an electronic design automation (EDA) system). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

At operation 402, circuit design data is configured for forming (e.g., fabricating) a printed circuit board that comprises an outer layer, where the outer layer comprises a first exterior surface and a set of embedded spaces, and where each embedded space has a second exterior surface. At operation 404, the circuit design data is (further) configured to dispose a set of components on the printed circuit board at the set of embedded spaces. For some embodiments, the operation 404 comprises configuring the circuit design data to route a wire or a connection of the printed circuit board around or beneath an embedded space formed on the outer layer of the printed circuit board. The circuit design data can be generated or configured by a circuit design system (e.g., an EDA system), which can assist in designing a printed circuit board, one or more components to be disposed on the printed circuit board, or disposing the components on the printed circuit board.

Figure 5:
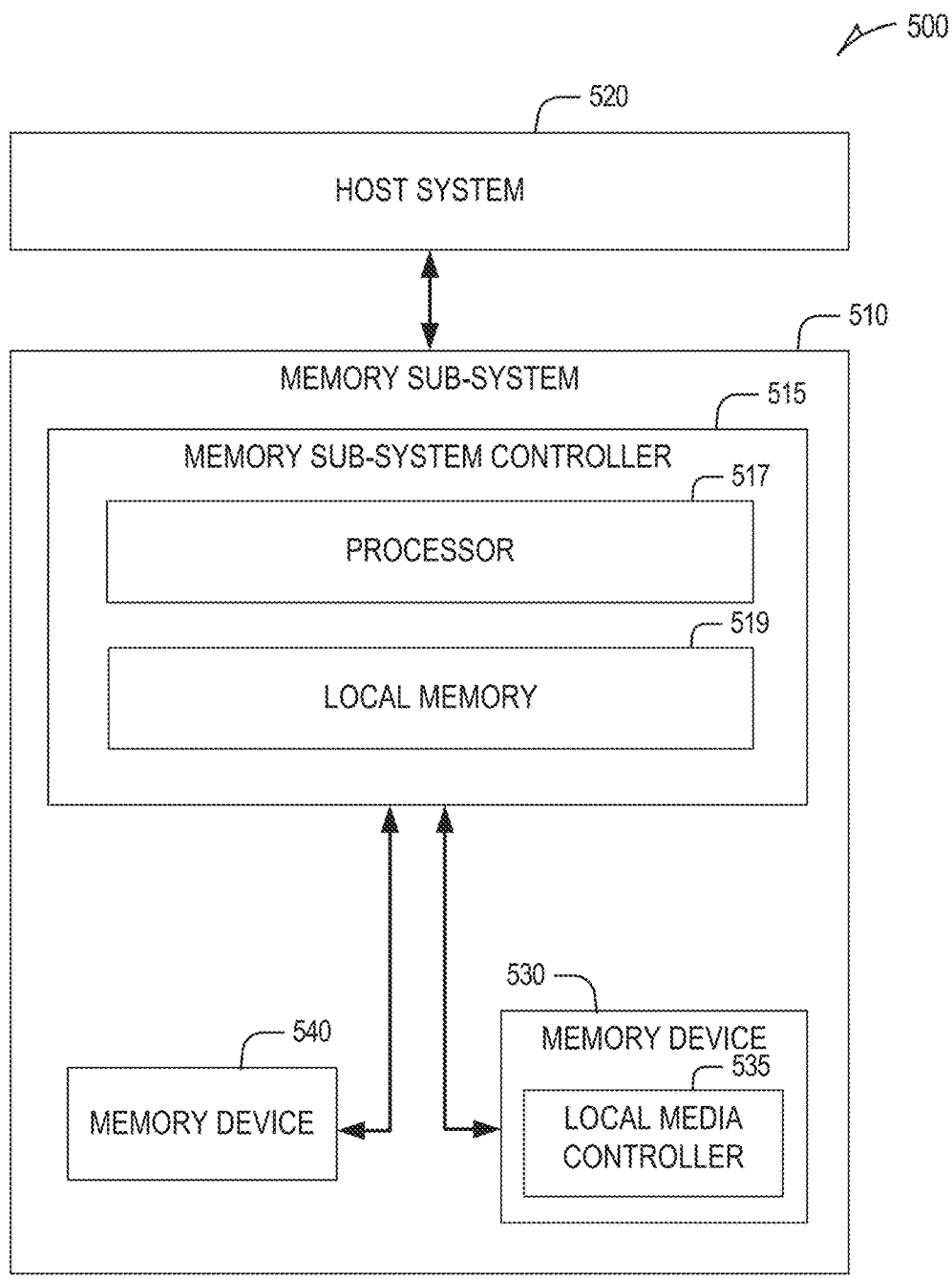
FIG. 5 is a block diagram illustrating a memory sub-system that can be implemented, at least in part, by an example printed circuit board, in accordance with some embodiments of the present disclosure.

FIG. 5 is a block diagram illustrating a memory sub-system 510 that can be implemented, at least in part, by an example printed circuit board, in accordance with some embodiments of the present disclosure. The memory sub-system 510 can include media, such as one or more volatile memory devices (e.g., memory device 540), one or more non-volatile memory devices (e.g., memory device 530), or a combination of such. A printed circuit board of an embodiment can implement one or more of the memory device 530, the memory device 540, a memory sub-system controller 515, or the memory sub-system 510.

A memory sub-system 510 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

Computing environment 500 includes a host system 520 that is coupled to one or more memory sub-systems 510. In some embodiments, the host system 520 is coupled to different types of memory sub-system 510. FIG. 5 illustrates one example of a host system 520 coupled to one memory sub-system 510. The host system 520 uses the memory sub-system 510, for example, to write data to the memory sub-system 510 and read data from the memory sub-system 510. As used herein, "coupled to" generally refers to a connection between components, which can be an indirect communicative connection or direct communicative connection (e.g., without intervening components), whether wired or wireless, including connections such as electrical, optical, magnetic, etc.

The host system 520 can be a computing device such as a desktop computer, laptop computer, network server, mobile device, embedded computer (e.g., one included in a vehicle, industrial equipment, or a networked commercial device), or such computing device that includes a memory and a processing device. The host system 520 can be coupled to the memory sub-system 510 via a physical host interface. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), etc. The physical host interface can be used to transmit data between the host system 520 and the memory sub-system 510. The host system 520 can further utilize an NVM Express (NVMe) interface to access the memory components (e.g., memory devices 530) when the memory sub-system 510 is coupled with the host system 520 by the PCIe interface. The physical host interface can provide an interface for passing control, address, data, and other signals between the memory sub-system 510 and the host system 520.

The memory devices can include any combination of the different types of non-volatile memory devices and/or volatile memory devices. The volatile memory devices (e.g., memory device 540) can be, but are not limited to, random access memory (RAM), such as dynamic random access memory (DRAM) and synchronous dynamic random access memory (SDRAM).

An example of non-volatile memory devices (e.g., memory device 530) includes a negative-and (NAND) type flash memory. Each of the memory devices 530 can include one or more arrays of memory cells such as single-level cells (SLCs) or multi-level cells (MLCs) (e.g., triple-level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 520. Furthermore, the memory cells of the memory devices 530 can be grouped as memory pages or memory blocks that can refer to a unit of the memory component used to store data.

Although non-volatile memory components such as NAND type flash memory are described, the memory device 530 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 515 can communicate with the memory devices 530 to perform operations such as reading data, writing data, or erasing data at the memory devices 530 and other such operations. The memory sub-system controller 515 can include hardware such as one or more integrated circuits and/or discrete components, a buffer memory, or a combination thereof. The memory sub-system controller 515 can be a microcontroller, special purpose logic circuitry (e.g., a field programmable gate array (FPGA), an application specific integrated circuit (ASIC), etc.), or other suitable processor.

The memory sub-system controller 515 can include a processor (processing device) 517 configured to execute instructions stored in local memory 519. In the illustrated example, the local memory 519 of the memory sub-system controller 515 includes an embedded memory configured to store instructions for performing various processes, operations, logic flows, and routines that control operation of the memory sub-system 510, including handling communications between the memory sub-system 510 and the host system 520.

In some embodiments, the local memory 519 can include memory registers storing memory pointers, fetched data, etc. The local memory 519 can also include read-only memory (ROM) for storing micro-code. While the example memory sub-system 510 in FIG. 5 has been illustrated as including the memory sub-system controller 515, in another embodiment of the present disclosure, a memory sub-system 510 may not include a memory sub-system controller 515, and may instead rely upon external control (e.g., provided by an external host, or by a processor or controller separate from the memory sub-system).

In general, the memory sub-system controller 515 can receive commands or operations from the host system 520 and can convert the commands or operations into instructions or appropriate commands to achieve the desired access to the memory devices 530. The memory sub-system controller 515 can be responsible for other operations such as wear leveling operations, garbage collection operations, error detection and error-correcting code (ECC) operations, encryption operations, caching operations, and address translations between a logical block address and a physical block address that are associated with the memory devices 530. The memory sub-system controller 515 can further include host interface circuitry to communicate with the host system 520 via the physical host interface. The host interface circuitry can convert the commands received from the host system into command instructions to access the memory devices 530 as well as convert responses associated with the memory devices 530 into information for the host system 520.

The memory sub-system 510 can also include additional circuitry or components that are not illustrated. In some embodiments, the memory sub-system 510 can include a cache or buffer (e.g., DRAM) and address circuitry (e.g., a row decoder and a column decoder) that can receive an address from the memory sub-system controller 515 and decode the address to access the memory devices 530.

In some embodiments, the memory devices 530 include local media controllers 535 that operate in conjunction with memory sub-system controller 515 to execute operations on one or more memory cells of the memory devices 530.

Figure 6:
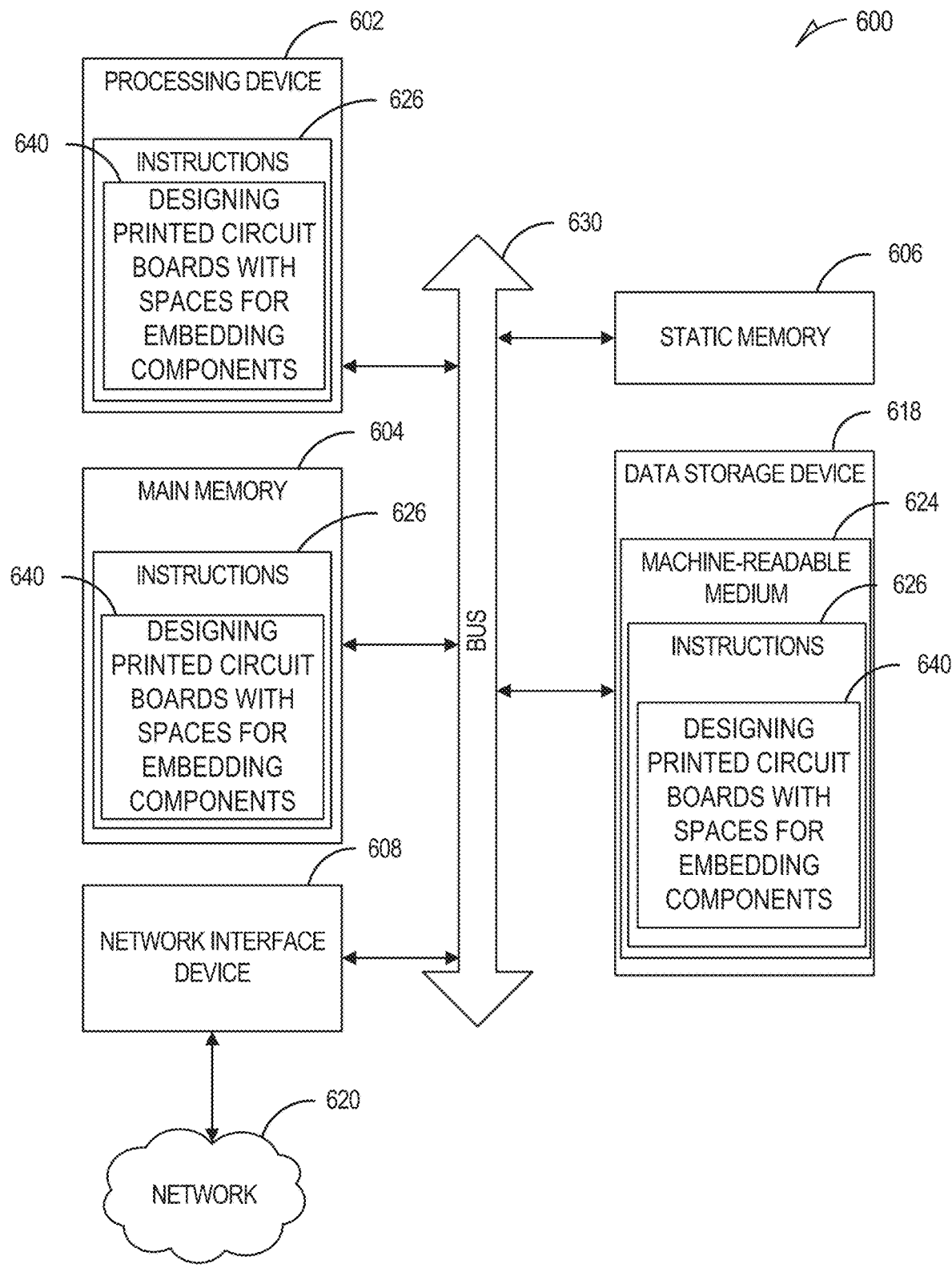
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 520 of FIG. 5) that includes, is coupled to, or utilizes a memory sub-system (e.g., the memory sub-system 510 of FIG. 5) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage device 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage device 618, and/or main memory 604 can correspond to the memory sub-system 510 of FIG. 5.

In one embodiment, the instructions 626 include instructions (e.g., for designing printed circuit boards with spaces for embedding components 640) to implement functionality corresponding to configuring circuit design data for a printed circuit board as described herein (e.g., the method 400 of FIG. 4). While the machine-readable storage medium 624 is shown, in an example embodiment, to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a printed circuit board that comprises an outer layer, the printed circuit board conforming with at least one of a solid-state drive (SSD) M.2 form factor or a solid-state drive (SSD) U.2 form factor, the outer layer comprising:
        a first exterior surface; and
        a set of embedded spaces, each embedded space of the set of embedded spaces having a second exterior surface that is positioned closer to a center of the printed circuit board than the first exterior surface;
        a set of components disposed at the set of embedded spaces, the set of components comprising a set of memory devices for storing data from a host system, the set of memory devices comprises at least one NAND-based memory device having a first coefficient of thermal expansion that is lower than a second coefficient of thermal expansion of the printed circuit board; and
        a memory sub-system controller operatively coupled to the set of memory devices, the memory sub-system controller enabling data transfer between the set of memory devices and the host system.

2. The system of claim 1, wherein a first component of the set of components is disposed on the printed circuit board at a first embedded space of the set of embedded spaces, and wherein the first component is disposed at the first embedded space by solder that couples a first side of the first component to the second exterior surface of the first embedded space.

3. The system of claim 1, wherein a first component of the set of components is disposed on the printed circuit board at a first embedded space of the set of embedded spaces, wherein a first side of the first component couples to the second exterior surface of the first embedded space, and wherein dimensions of the first embedded space allow for the first embedded space to receive the first side of the first component.

4. The system of claim 1, wherein a first component of the set of components is disposed on the printed circuit board at a first embedded space of the set of embedded spaces, and wherein a depth of the second exterior surface of the first embedded space, relative to the first exterior surface, is sufficient to embed a set of interconnects of the first component into the outer layer.

5. The system of claim 1, wherein a first component of the set of components is disposed on the printed circuit board at a first embedded space of the set of embedded spaces, and wherein a depth of the second exterior surface of the first embedded space, relative to the first exterior surface, is sufficient to embed an outer package the first component into the outer layer.

6. The system of claim 1, wherein at least one component of the set of components comprises a surface-mounted integrated circuit package.

7. The system of claim 1, wherein the printed circuit board comprises at least one route disposed below at least one embedded space of the set of embedded spaces.

8. A method comprising:
   forming a printed circuit board that comprises an outer layer, the printed circuit board conforming with at least one of a solid-state drive (SSD) M.2 form factor or a solid-state drive (SSD) U.2 form factor, the outer layer comprising:
   a first exterior surface; and
   a set of embedded spaces, each embedded space having a second exterior surface that is positioned closer to a center of the printed circuit board than the first exterior surface; and
   disposing a set of components on the printed circuit board at the set of embedded spaces, the set of components comprising:
   a set of memory devices for storing data from a host system, the set of memory devices comprises at least one NAND-based memory device having a first coefficient of thermal expansion that is lower than a second coefficient of thermal expansion of the printed circuit board; and
   a memory sub-system controller operatively coupled to the set of memory devices, the memory sub-system controller enabling data transfer between the set of memory devices and the host system.

9. The method of claim 8, wherein the forming of the printed circuit board comprises:
   prior to forming the outer layer of the printed circuit board, disposing a set of placeholder components on an intermediate layer of the printed circuit board;
   forming the outer layer on the intermediate layer of the printed circuit board; and
   removing the set of placeholder components to form the set of embedded spaces in the outer layer of the printed circuit board.

10. The method of claim 8, wherein the forming of the printed circuit board comprises:
    forming the outer layer on an intermediate layer of the printed circuit board; and
    etching a set of portions of the outer layer to form the set of embedded spaces.

11. The method of claim 8, wherein the disposing of the set of components on the printed circuit board at the set of embedded spaces comprises:
    coupling a first component of the set of components to the second exterior surface of a first embedded space of the set of embedded spaces.

* * * * *